(12) United States Patent
Schoessow

(10) Patent No.: US 11,342,169 B2
(45) Date of Patent: May 24, 2022

(54) MULTI FREQUENCY LC RESONATOR TOPOLOGIES APPLICABLE TO MASS SPECTROMETER RADIO-FREQUENCY DRIVE SYSTEMS

(71) Applicant: Agilent Technologies, Inc., Santa Clara, CA (US)

(72) Inventor: Michael Schoessow, Santa Clara, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 16/842,988

(22) Filed: Apr. 8, 2020

(65) Prior Publication Data

US 2020/0328070 A1 Oct. 15, 2020

Related U.S. Application Data

(60) Provisional application No. 62/833,114, filed on Apr. 12, 2019.

(51) Int. Cl.
| | |
|---|---|
| *H01J 49/02* | (2006.01) |
| *H03F 3/45* | (2006.01) |
| *H01J 49/40* | (2006.01) |
| *H01J 49/42* | (2006.01) |

(52) U.S. Cl.
CPC ............ *H01J 49/022* (2013.01); *H01J 49/40* (2013.01); *H01J 49/4225* (2013.01); *H03F 3/45475* (2013.01); *H03F 2200/451* (2013.01); *H03F 2203/45594* (2013.01)

(58) Field of Classification Search
CPC ........... H01J 49/022; H03F 1/56; H03F 3/191
USPC .................................. 250/285; 330/302, 305
See application file for complete search history.

(56) References Cited

U.S. PATENT DOCUMENTS

| | | | |
|---|---|---|---|
| 5,300,772 A * | 4/1994 | Buttrill, Jr. | ........... H01J 49/424 250/282 |
| 5,354,988 A | 10/1994 | Jullien | |
| 6,075,244 A * | 6/2000 | Baba | .................. H01J 49/4215 250/281 |
| 6,483,244 B1 | 11/2002 | Kawato et al. | |
| 6,762,561 B1 | 7/2004 | Kawato | |
| 8,847,433 B2 | 9/2014 | Vandermey | |

(Continued)

FOREIGN PATENT DOCUMENTS

CN 104682755 A 6/2015

OTHER PUBLICATIONS

Final rejection, U.S. Appl. No. 16/176,115, dated Feb. 27, 2020, 27 Pages.

(Continued)

*Primary Examiner* — Hafizur Rahman
(74) *Attorney, Agent, or Firm* — Mannava & Kang, P.C.

(57) ABSTRACT

In one embodiment, a power source for providing high-voltage radio-frequency (RF) energy to an instrument such as a mass spectrometer includes an RF power amplifier having an output, an oscillating RF signal generator configured to provide first and second RF signals respectively oscillating at first and second frequencies to the RF power amplifier, and a step-up circuit for magnifying the RF power amplifier output. The step-up circuit includes an LC resonator network tuned to the first and second frequencies, and an output for providing the magnified voltage to a rod assembly of the mass spectrometer.

21 Claims, 10 Drawing Sheets

(56) References Cited

U.S. PATENT DOCUMENTS

| | | |
|---|---|---|
| 10,284,154 B1 | 5/2019 | Schoessow |
| 2005/0263698 A1 | 12/2005 | Kawato |
| 2007/0018629 A1 | 1/2007 | Potvin et al. |
| 2008/0048112 A1 | 2/2008 | Makarov et al. |
| 2011/0101218 A1 | 5/2011 | Makarov et al. |
| 2014/0347104 A1 | 11/2014 | Taylor et al. |
| 2014/0361163 A1* | 12/2014 | Taniguchi ............ H01J 49/022 250/287 |
| 2015/0228469 A1 | 8/2015 | Mizutani |

OTHER PUBLICATIONS

Non-Final rejection, U.S. Appl. No. 16/176,115, dated Nov. 13, 2019, 17 Pages.

Requirement for Election/Restriction, U.S. Appl. No. 16/176,115, dated Aug. 23, 2019, 6 Pages.

Schoessow, Coupled-Amplifier Multi-Frequency Circuit Topologies Applicable to Mass Spectrometer Radio-Frequency Drive Systems, U.S. Appl. No. 62/873,321, filed Jul. 12, 2019, 28 Pages.

* cited by examiner

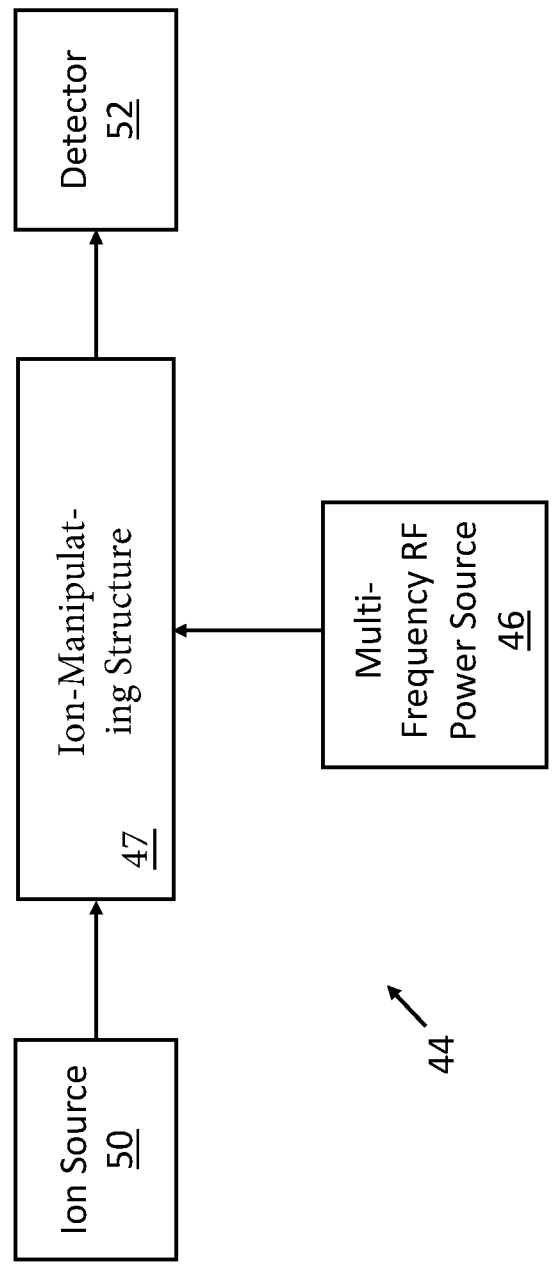

MULTI FREQUENCY LC RESONATOR TOPOLOGIES APPLICABLE TO MASS SPECTROMETER RADIO-FREQUENCY DRIVE SYSTEMS

CROSS REFERENCE TO RELATED APPLICATIONS

This application claims the benefit of U.S. Provisional Pat. App. No. 62/833,114 filed on Apr. 12, 2019, the contents of which are incorporated herein by reference in their entirety.

This application may be considered related to U.S. patent application Ser. No. 16/176,115 "Frequency Switching Method Applicable to Mass Spectormeter Multipole RF Drive Systems" filed on Nov. 5, 2018, and to U.S. Provisional App. No. 62/873,321 filed on Jul. 12, 2019.

TECHNICAL FIELD

The present disclosure relates generally to radio-frequency power generation for mass spectrometers.

BACKGROUND

Many mass spectrometers require a source of high-voltage radio-frequency energy to apply to various ion-guiding assemblies, including but not limited to multi-rod assemblies (quadrupole, hexapole, octupole or other) within a vacuum manifold. These high-voltage RF voltage sources are typically produced with resonant LC (inductor-capacitor) networks configured to step up the output voltage of RF power amplifiers. The amplifiers are fed signals from oscillators or synthesizers operating at the resonant frequencies of the LC step-up networks.

The choices of frequencies typically involve compromises between various performance attributes, and each rod assembly generally receives a voltage waveform at a single operating frequency. The choice of operating frequency in a mass spectrometer involves trade-offs: a higher frequency yields higher mass resolution while a lower frequency yields better sensitivity for a given RF power level. Spectrometers have generally been designed to operate at a single frequency, chosen as a compromise between resolution, sensitivity, and RF power requirements.

For a given instrument running a particular experiment, the desired frequency is normally fixed. The amplitude, however, must be settable over a wide range, such as 50V to 10 kVpp (as one example). Constancy is required in both the amplitude and the frequency once a given level and frequency are set, and a precise source of very high voltage radio-frequency sine waves is required. In some applications, for example in resolver technology, a second, much lower amplitude frequency is applied, but multiple frequencies at comparable high voltage levels have not been used.

For single-frequency voltage magnification, classic resonant voltage step-up topologies are well-suited and commonly used. There are two basic LC topologies that are used to accomplish the voltage step-up. They are sometimes referred to as the parallel, or shunt drive, resonant approach; and the series resonant approach. Generally, an oscillator is used to drive a radio-frequency power amplifier, which in turn drives a high-Q LC resonator tuned to the same frequency as the oscillator. The resonator greatly magnifies the drive voltage from the power amplifier. More specifically, in the series resonant topology, illustrated in FIG. 1A, the RF power amplifier 10 with differential outputs, which approximates a voltage source (very low output resistance), directly drives the bases of the resonator inductors 12a and 12b of LC step-up network 14. The high-voltage output is then taken from the other ends of the inductors. Z represents a network with DC conduction and appropriately high impedance at the operating frequency. The voltage magnification is achieved entirely through resonant rise (at resonance the phase shift across the inductor is 90 degrees, or a quarter wave, corresponding to a voltage minima at the drive end and a voltage maxima at the other end). The voltage step-up is equal to the circuit Q (quality factor). The Q Factor in this case includes all circuit losses, including those contributed by the load, such as resistive rods if those are used.

FIG. 1B shows a circuit that facilitates an analysis of the RF performance of the FIG. 1A topology. The associated equations (ignoring losses) are:

$$F = \frac{1}{2\pi\sqrt{LC_R}} \quad (1)$$

$$Z(s) = A\left[\frac{s^2 + B}{s}\right]$$

$$A = \frac{1}{L}$$

$$B = \frac{1}{LC_R}$$

Z(s) is the driving point impedance looking into the LC network, wherein s is the complex frequency variable. The concepts of driving point impedance and the complex frequency variable will be familiar to those versed in the art of RF network and filter design. The driving point impedance goes to zero at the frequency indicated by B, which is also the frequency at which the voltage magnification peaks to infinity, in this case at $F=1/(2\pi\sqrt{LC})$. The s in the denominator of Z(s) denotes the pole at the origin caused by the load capacitance $C_R$, which goes to infinite impedance as the frequency goes to zero. In real-world circuits the components, especially inductors, exhibit loss. The effects of this are that, at resonance, the driving point impedance reaches a minimum but does not go to zero, while the magnification peaks at a finite value.

In the parallel resonant approach, illustrated in FIG. 2, an output of an RF amplifier 15 is connected to a small primary winding 16 that is coupled by mutual inductance to the two resonator windings 17. The voltage step-up is achieved through transformation (transformer action), with the step-up approximating the turns ratio between the primary winding and the two resonator windings.

A disadvantage of the resonator approaches above is that a given LC resonant circuit as implemented in the prior art only works to step up the RF voltage efficiently at a single, fixed frequency. Operation at multiple frequencies, simultaneously or otherwise, is not performed. Running the mass spectrometer at a different frequency than that to which the resonator and oscillator are tuned was only accomplished manually, by switching the spectrometer power off (or at least putting the machine into some sort of stand-by mode), mechanically dismounting the quad driver or the LC resonant circuit assembly and replacing it with a different quad driver and LC resonant circuit assembly that operate at a different frequency, and then powering the spectrometer back up. This is inconvenient and required the services of an experienced technician, introducing significant delays and costs. Moreover, it is not possible under this prior regime to run an experiment at two different frequencies substantially simultaneously in order to attain both high resolution and high sensitivity.

OVERVIEW

Described herein is an economical and elegant arrangement for providing high voltage RF at multiple frequencies, for example to power an ion-manipulating structure such as a rod assembly of a mass spectrometer. The multiple frequencies can be provided simultaneously or non-simultaneously, whereby operation can be quickly switched between two or more different operating frequencies. The use of two or more frequencies can allow optimization of sensitivity (low frequency) or resolution (high frequency), or both in the case of simultaneous operation at multiple frequencies. In certain embodiments, the data from the two operating modes can be combined to provide both high resolution and high sensitivity in a given experiment.

In certain embodiments, the topologies described resonate at multiple frequencies. In certain embodiments, the circuits include two separate frequency sources feeding a summer, which then feeds the amplifier. These topologies allow operation at two or more frequencies simultaneously or, alternatively, operation at one of two or more frequencies without any need to power down, change out assemblies, or switch in different resonator components.

In some mass spectrometer implementations contemplated herein, there can be performance advantages in hexapole or octupole cell operation if one of the rod sets is driven with two frequencies simultaneously. There may also be advantages in using more than two frequencies or in driving more than one rod set with multiple frequencies.

The use of multiple frequencies in hexapole and octupole cells can eliminate the requirement for the use of resistive rods and allow less costly conductive metal rods to be used instead. The ability to switch between multiple frequencies of operation in rod assemblies as contemplated herein allows the user to select the frequency yielding the optimum trade-offs between resolution, sensitivity, and RF power requirement for any given experiment. The described arrangement allows near instantaneous switching of the frequency of operation. It also potentially reduces cost by eliminating the need for multiple quad drivers or resonator assemblies required by prior art techniques which relied on swapping out of parts as described above.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings:

FIG. 7 is a block diagram of a mass spectrometer using a multi-frequency RF power source in accordance with certain embodiments.

DESCRIPTION OF EXAMPLE EMBODIMENTS

The following description is illustrative only and is not intended to be in any way limiting. Other embodiments will readily suggest themselves to those of ordinary skill in the art having the benefit of this disclosure. Reference will be made in detail to implementations of the example embodiments as illustrated in the accompanying drawings. The same reference indicators will be used to the extent possible throughout the drawings and the following description to refer to the same or like items.

In the description of example embodiments that follows, references to "one embodiment", "an embodiment", "an example embodiment", "certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the interest of clarity, not all of the routine features of the implementations described herein are shown and described. It will be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The term "exemplary" when used herein means "serving as an example, instance or illustration." Any embodiment described herein as "exemplary" is not necessarily to be construed as preferred or advantageous over other embodiments.

Figure 1A:
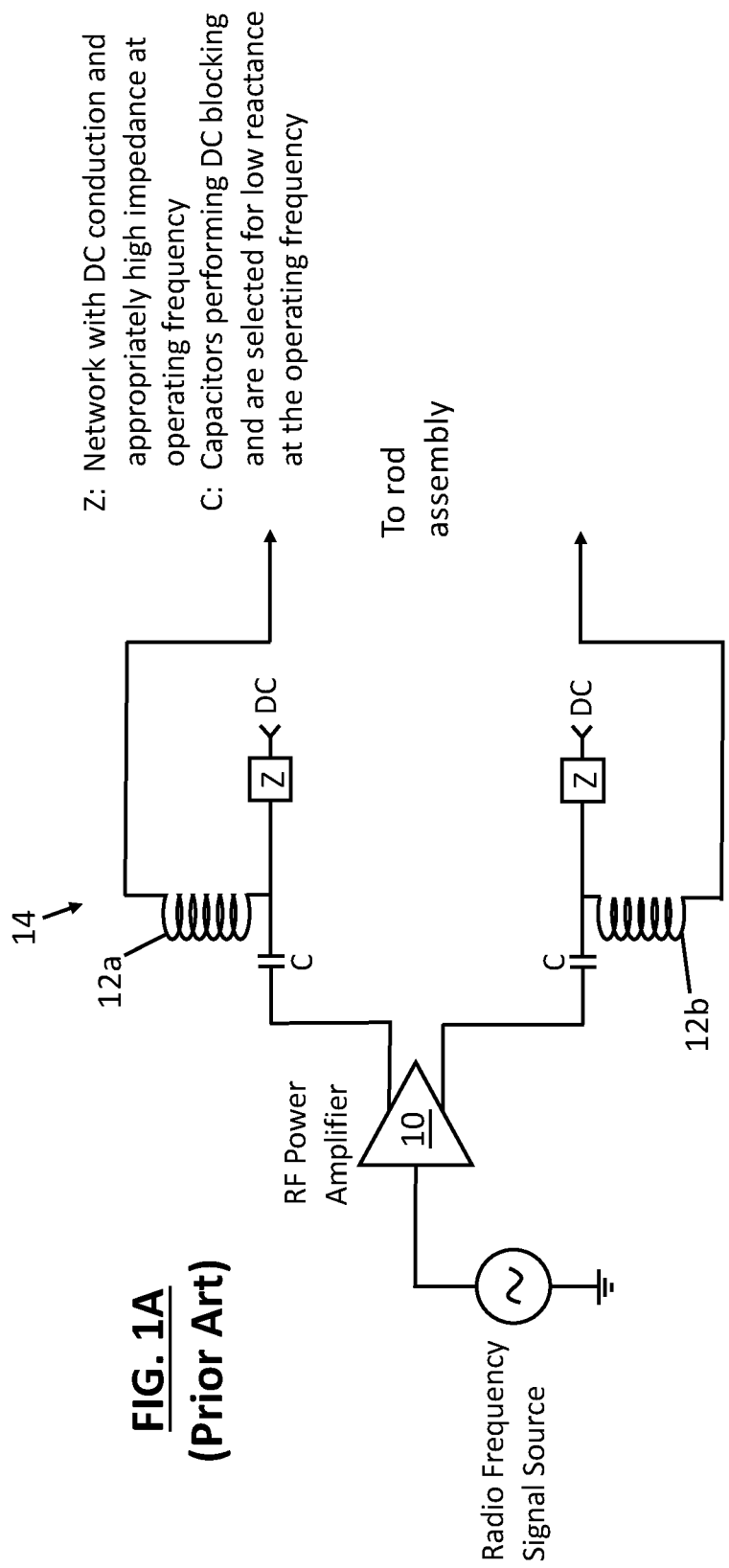
FIG. 1A is a schematic diagram of a conventional single-frequency power source having a series resonant topology.
Figure 1B:
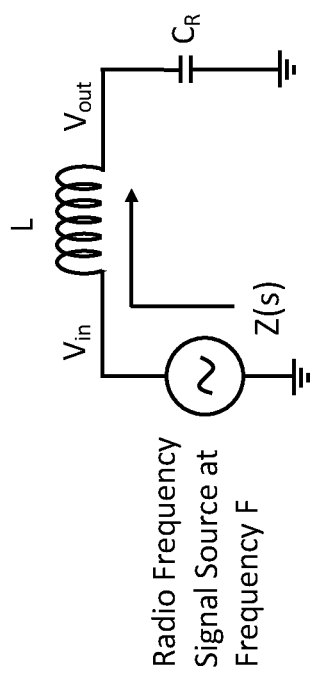
FIG. 1B is a schematic of a circuit used for performance analysis of the FIG. 1A topology.
Figure 3B:
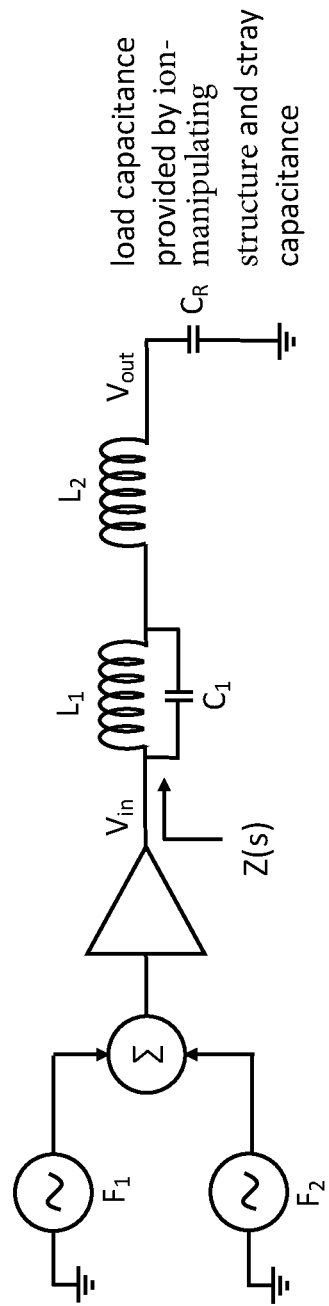
FIG. 3B a simplified illustration of the FIG. 3A topology that facilitates RF analysis.
Figure 2:
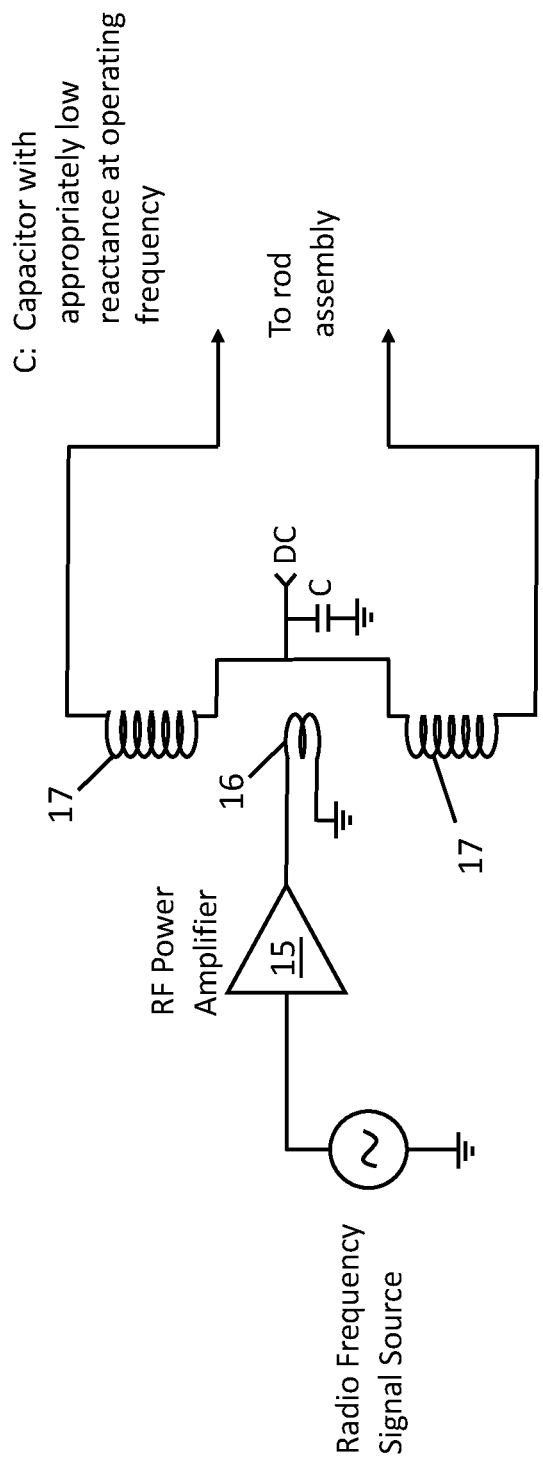
FIG. 2 is a schematic diagram of a conventional single-frequency power source having a parallel resonant topology. Although a single DC source is shown, in some applications separate DC voltages can be applied to each output.
Figure 3A:
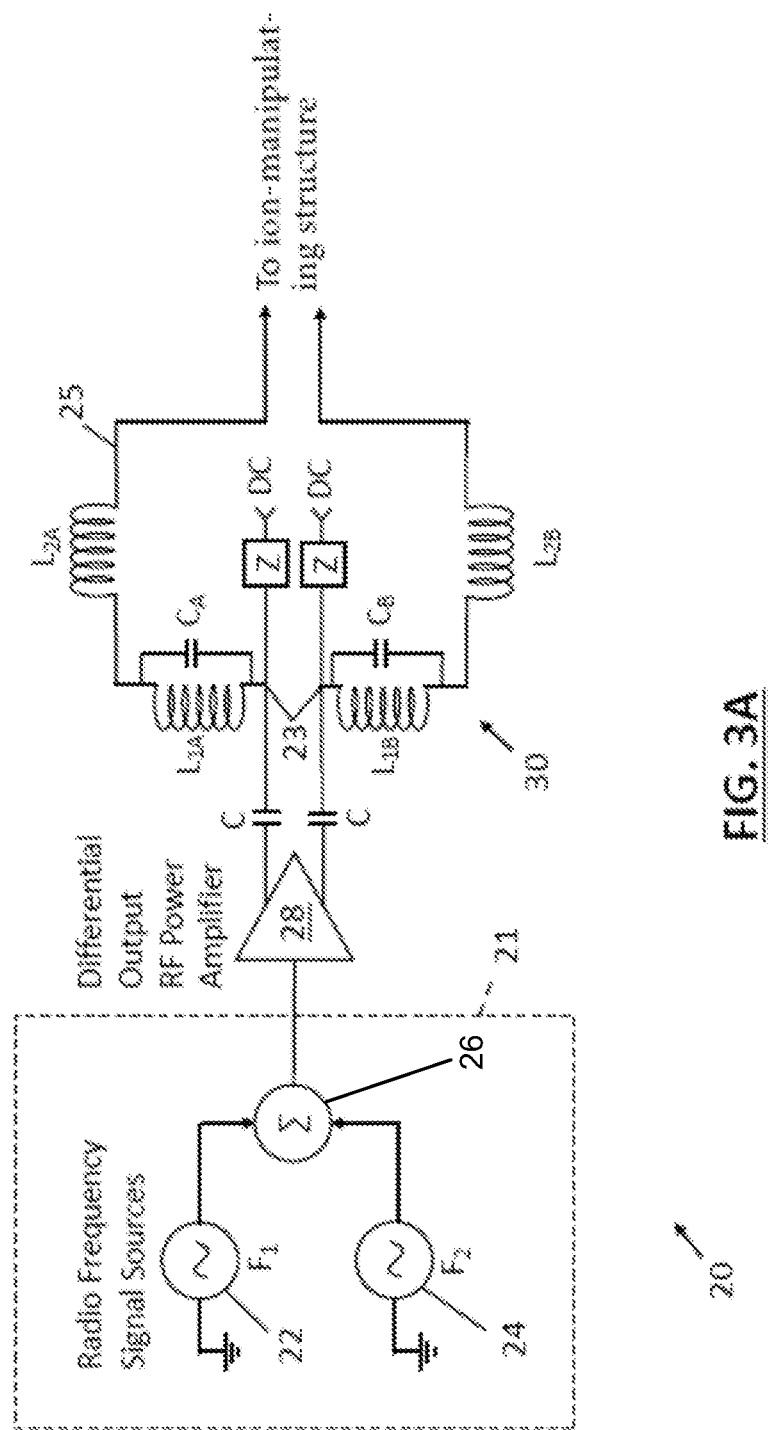
FIG. 3A is a schematic diagram of a series resonant multi-frequency RF power source for use with a mass spectrometer in accordance with certain embodiments.

FIG. 3A is a schematic diagram of a multi-frequency RF power source 20 for use with an instrument such as a mass spectrometer (not shown) in accordance with certain embodiments. The RF power provided by power source 20 in this example is at two frequencies $F_1$ and $F_2$, although more frequencies are contemplated, and is applied to an ion-manipulating structure, for example a rod assembly consisting of any number of rods (quadrupole, hexapole, octupole, etc.), depending on the application. "Rod assembly" may be used interchangeably herein with "ion-manipulating structure" by way of convenience, not limitation. In certain embodiments, the RF power provided by power source 20 may be applied to a stack of ring electrodes as the ion-manipulationg structure.

The two frequencies $F_1$ and $F_2$ are respectively generated by RF signal sources 22 and 24, which can be in the form of oscillators or one or more synthesizers. The oscillating outputs of RF signal sources 22 and 24 are combined by RF summer 26, and the combined signal is fed as the input to RF power amplifier 28. More generally, an oscillating RF signal generator 21 is depicted as the source of the combined signals at frequencies $F_1$ and $F_2$. These signals can be provided concurrently with one another. Alternatively, they can be provided sequentially, in any sequence or combination of sequences, depending for example on user selection or automatic programming. Additional signals at different frequencies can also be provided by oscillating RF signal generator 21, also concurrently or based on user or system selection.

The differential output of RF power amplifier 28 is applied to LC step-up network 30, with the amplifier, which approximates a voltage source (very low output resistance at each of its outputs), directly driving the base 23 of the resonator inductor of the LC step-up network. The network is configured to resonate at the two frequencies $F_1$ and $F_2$, based on a series drive configuration utilizing inductors $L_{1A}$ and $L_{2A}$ in series in one branch, and inductors $L_{1B}$ and $L_{2B}$ in series in the other branch. Capacitor $C_A$ is connected across inductor $L_{1A}$, and capacitor $C_B$ is connected across inductor $L_{1B}$. The output of LC step-up network 30 is provided to the ion-manipulating structure, which may be a rod assembly (not shown). The capacitors C perform DC blocking and are selected for low reactance at the operating frequencies. The Z networks provide DC conduction and appropriately high impedance at the operating frequencies. The high-voltage output to the ion manipulating structure of the mass spectrometer is then taken from the other end 25 of the series inductors. The voltage magnification is achieved entirely through resonant rise (at resonance the phase shift across the inductor is 90 degrees, or a quarter wave, corresponding to a voltage minima at the drive end and a voltage maxima at the other end). The voltage step-up ratio is equal to the circuit Q (quality factor). The Q factor in this case includes the effects of all circuit losses, including those contributed by the load.

It will be appreciated that in certain embodiments, depending on the power level of the oscillating signal sources, the use of RF power amplifier 28 may not be necessary. For example, if RF signal sources 22 and 24 comprised high-power fundamental oscillator(s), there would be no need to boost their output in certain embodiments, and the use of RF power amplifier 28 could be eliminated.

FIG. 3B shows a simplified illustration of the FIG. 3A topology that facilitates RF analysis of the circuit. Only one of the two phases is shown for simplicity and some components not involved in the resonant circuit (such as the DC blocking caps and the Z blocks) are not shown. Note the designation of Z(s) (the impedance looking into the LC network in terms of the complex frequency variable, s). Note also the Vin and Vout designations on the schematic. The associated equation in general form is:

$$Z(s) = A\left[\frac{(s^2 + B)(s^2 + C)}{s(s^2 + D)}\right] \quad (2)$$

A through D are constants and s is the complex frequency variable. Constant A is a fixed gain term. Constants B and C indicate the two frequencies at which Z(s) goes to zero and $V_{out}/V_{in}$ goes to infinity (assuming no losses). Constant D indicates a frequency at which Z(s) goes to infinity, and $V_{out}/V_{in}$ goes to zero. It will always be between the two frequencies indicated by B and C. The additional s in the denominator represents the pole at the origin caused by the series capacitance at the load or, in other words, the fact that the resonator input impedance goes to infinity at DC.

Figure 3C:
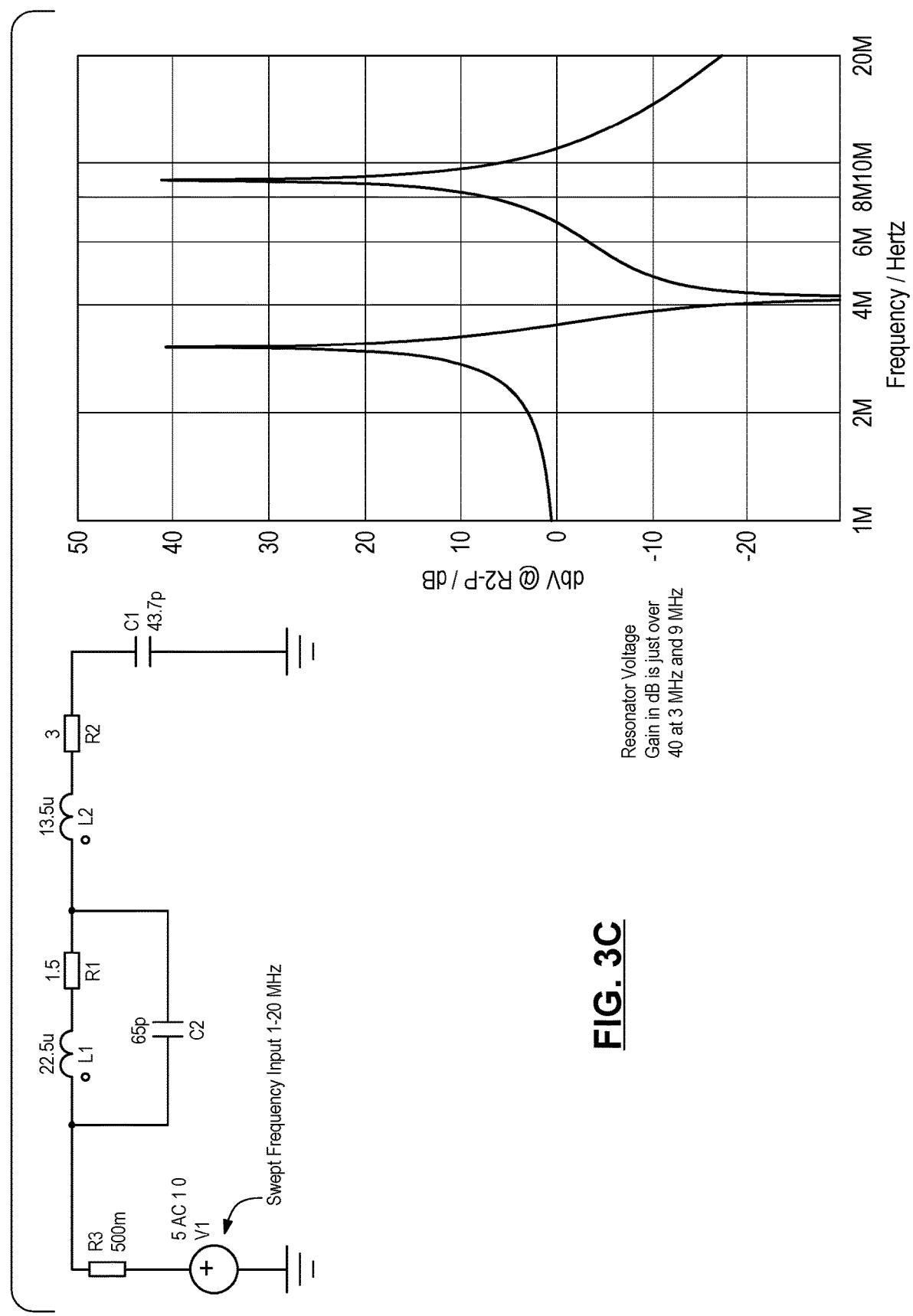
FIG. 3C is a schematic diagram and performance results relating to a 7-component simulation circuit for verifying the principle of operation of the multi-frequency power source of FIG. 3A.

FIG. 3C is a schematic diagram and performance results relating to a 7-component simulation circuit for verifying the principle of operation of multi-frequency power source 20 of FIG. 3A. As seen in FIG. 3C, the frequencies of the voltage magnification peaks are 3 MHz and 9 MHz. The frequency where transmission through the resonator goes to a minimum is 4.2 MHz.

Measurements of a build up of the 7-component simulation, using a function generator with a 0.5-ohm resistor connected across its output to simulate the voltage source with a 0.5-ohm output resistance, show very good agreement with the simulation.

Figure 3D:
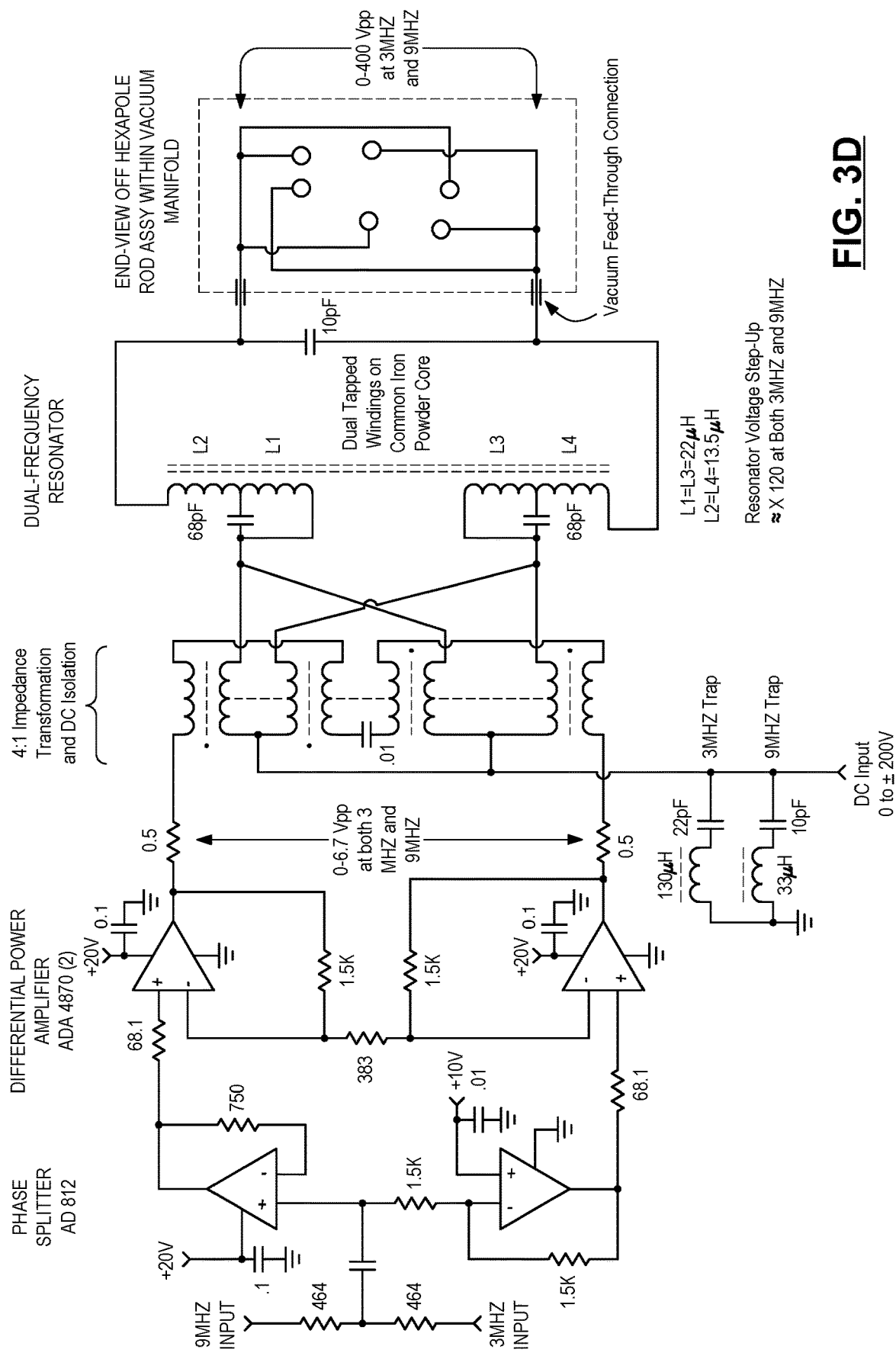
FIG. 3D is a schematic diagram of an example practical circuit implementation of the FIG. 3A topology.

An example practical circuit implementation of the FIG. 3A topology is shown in FIG. 3D, with some detail differences. The differences are:

1. The coupling capacitors C in FIG. 3A have been replaced with a DC-isolating transmission-line transformer. In certain embodiments, a flux-coupled transformer, for example with coupling capacitors, can be used.
2. The transformer also performs a 4:1 impedance transformation between the power amplifier and the resonator assembly. This allows more efficient power transfer into the resonator.
3. A single DC voltage is applied to both rod sets rather than using a bipolar DC supply split between the two rod triples.
4. The DC voltage for the rod assembly is injected into the circuit via taps on the transformer rather than via the Z blocks shown in FIG. 3A.

Figure 4:
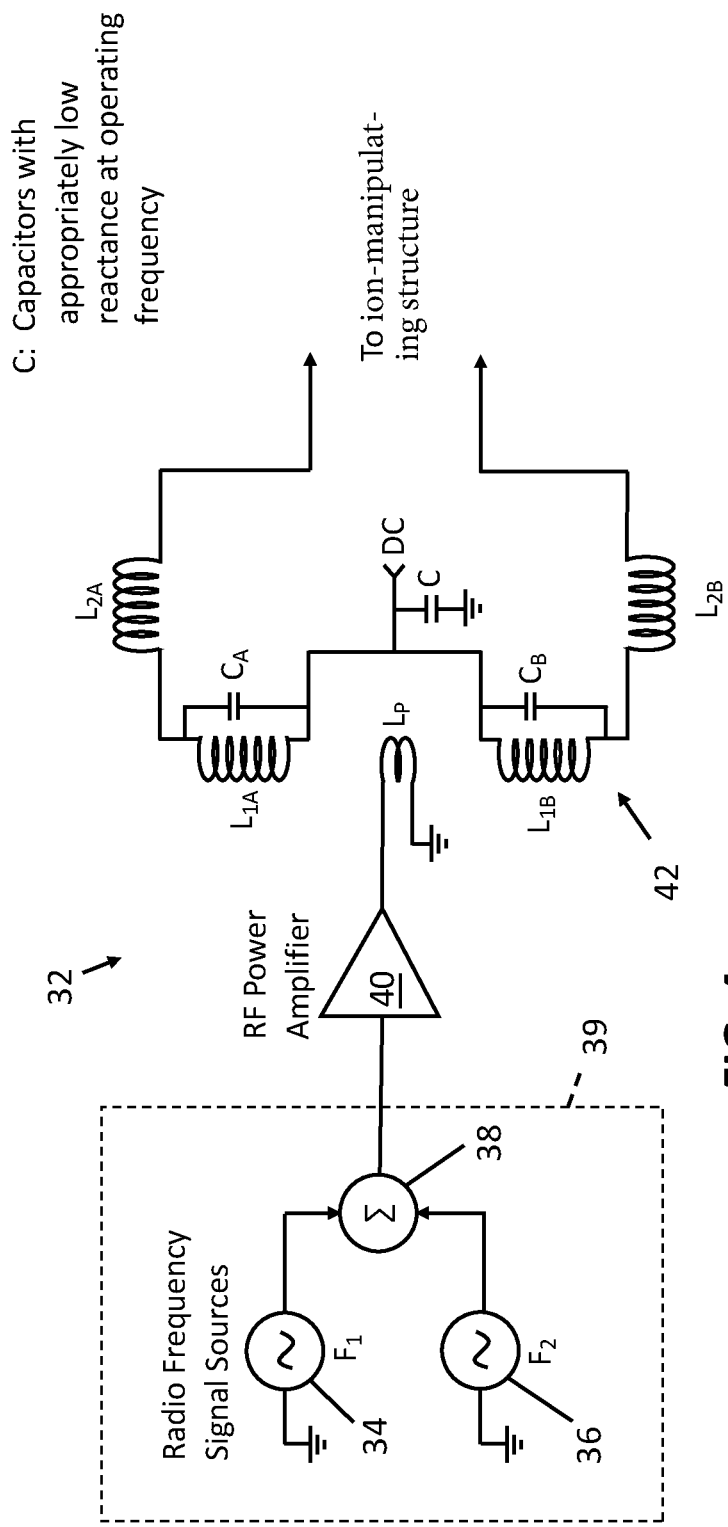
FIG. 4 is a schematic diagram of a multi-frequency RF power source for use with a mass spectrometer having a parallel-series drive configuration in accordance with certain embodiments.

FIG. 4 is a schematic diagram of a multi-frequency RF power source 32 for use with an instrument such as a mass spectrometer (not shown) having a parallel-series drive configuration in accordance with certain embodiments. The RF power provided by power source 32 in this example is also at two frequencies $F_1$ and $F_2$, although more frequencies are contemplated, and is applied to an ion-manipulating structure, for example a rod assembly consisting of any number of rods (quadrupole, hexapole, octupole, etc.), depending on the application.

The two frequencies $F_1$ and $F_2$ are respectively generated by RF signal sources 34 and 36, which can be in the form of oscillators or one or more synthesizers. The oscillating outputs of RF signal sources 34 and 36 are combined by RF summer 38, and the combined signal is fed as the input to RF power amplifier 40. More generally, an oscillating RF signal generator 39 is depicted as the source of the combined signals at frequencies $F_1$ and $F_2$. Additional signals at different frequencies can also be provided by oscillating RF signal generator 39.

The output of RF power amplifier 40 is applied to LC step-up network 42. This network is configured to resonate at the two frequencies $F_1$ and $F_2$, based on a parallel-series drive configuration utilizing inductors $L_{1A}$ and $L_{2A}$ in series in one branch, and inductors $L_{1B}$ and $L_{2B}$ in series in the other branch, but with the coupling to the power amplifier being by way of primary winding $L_P$. Capacitor $C_A$ is connected across inductor $L_{1A}$, and capacitor $C_B$ is connected across inductor $L_{1B}$. The output of LC step-up network 42 is provided to the ion manipulating structure, which may be a rod assembly (not shown). The capacitors C exhibit appropriately low reactance at the operating frequencies. The Z networks provide DC conduction and appropriately high impedance at the operating frequencies. The voltage magnification is achieved through transformation (transformer action), with the step-up ratio approximating the turns ratio of the windings of resonant inductors $L_{1A}$ and $L_{2A}$.

It will be appreciated that in certain embodiments, depending on the power level of the oscillating signal sources, the use of RF power amplifier 40 may not be necessary. For example, if RF signal sources 34 and 36 comprised high-power fundamental oscillator(s), there would be no need to boost their output in certain embodiments, and the use of RF power amplifier 40 could be eliminated.

In addition, although FIGS. 3A and 4 show circuits with a differential output to the ion manipulating structure/rod assembly, single-phase circuits in which a single RF voltage is applied to all elements of an assembly with respect to ground can be used. In such a case "ground" may consist of some type of shroud or shield surrounding the assembly. The vacuum manifold structure would also normally be at RF ground potential.

Figure 5B:
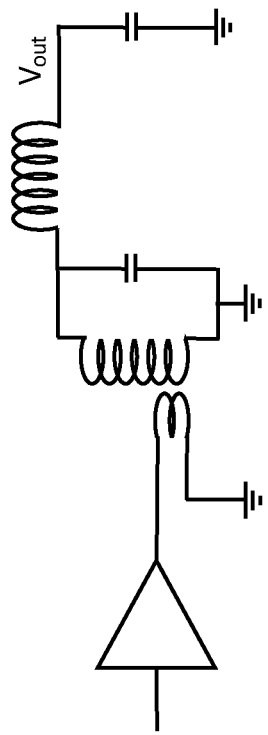
FIGS. 5A-5C schematic diagrams showing alternative topologies that can be used produce two resonance peaks in accordance with certain embodiments.
Figure 5C:
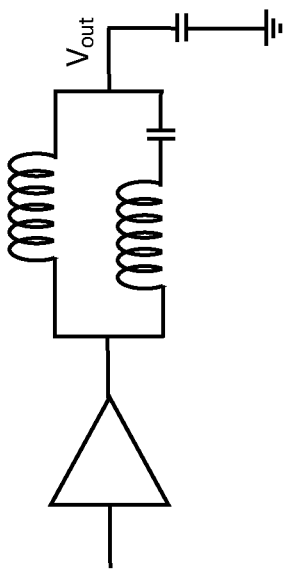
Figure 5A:
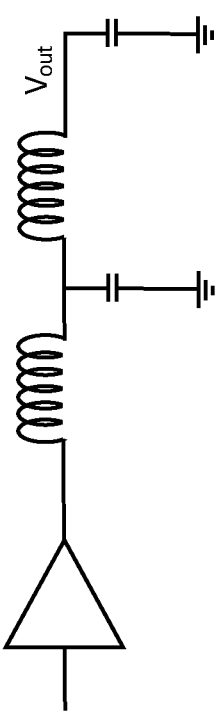

FIGS. 5A through 5C show alternative topologies that can be used to produce two resonance peaks in accordance with certain embodiments. FIG. 5A depicts a series-driven LC resonant network, in which the first and second inductors are connected in series, with the second inductor being coupled between two grounded capacitors. FIG. 5B depicts a series-parallel driven LC resonant network that is coupled to the RF power amplifier via a primary inductor winding, with first and second series-connected inductors in which the second inductor is coupled between two grounded capacitors. FIG. 5C depicts an LC resonant network having a series-parallel topology. The FIGS. 5A through 5C topologies can also be represented by the equation (2) above. Those versed in the art will appreciate that various additional topologies to accomplish the dual resonance voltage step-up are possible, not all of which can be represented by the equation (2). The choice of topology in a practical implementation will come down to factors involving the frequency spacings required, power supply considerations (which affect impedance matching requirements), available physical space, and so on.

Figure 6:
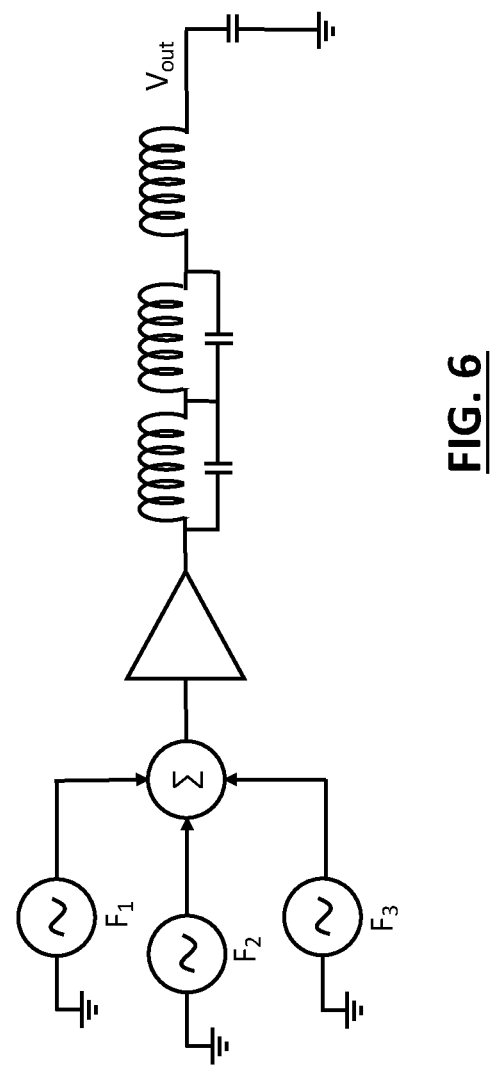
FIG. 6. shows an example of a topology that can be used to provide three different frequencies, simultaneously or selectively in accordance with certain embodiments.

It will be appreciated that the principles used herein can be extended to the use of more than two frequencies, whereby additional signal sources can be used in conjunction with an LC step-up network configured to oscillate at the additional frequencies for application to the ion manipulating structure/rod assembly. FIG. 6 shows an example of a topology that can be used to provide three different frequencies, simultaneously or selectively. Those versed in the art will appreciate that various other topologies are possible for operation at three (or more) frequencies. Topologies designed for operation at more than two frequencies may be, in general, less efficient than ones that work at only two frequencies, with efficiency relating to the ratio of attainable RF output high-voltage magnitude to the required RF power amplifier cost and size. The resonator networks described herein do not necessarily dissipate significant amounts of power (because, in certain embodiments, the various impedance elements in them are mostly reactive rather than resistive, and only resistive elements dissipate power). However, in certain embodiments, the networks may require higher levels of circulating RF current than do single-frequency resonators. As a result, the product of the RF voltage magnitude and the RF current magnitude (this product is typically referred to as VA) that the amplifier is required to produce is higher than with single-frequency resonators. When the voltage and current waveforms in the load that an amplifier is driving are in phase with each other, the power dissipated in the load in watts equals the VA. When they are 90 degrees out of phase the power in the load is zero no matter what the VA is. The voltage swing capability and the current output capability of the amplifier must be based upon the VA that must be supported however so, even in cases where very little power is dissipated in the load, a large power amplifier is required if the VA is high. The same applies to the capacity of the DC power supply feeding the amplifier.

In certain embodiments, the resonator inductors may be either air core or iron-powder core. In some cases other core materials such as ferrite, metal, laminated metal, or more exotic materials or combinations of materials may be advantageous. Similarly, winding shape may vary depending on the application (solenoid, toroid, flat spiral, or others).

In certain embodiments, modest amounts of mutual inductance between the multiple inductances in the resonator assembly is not necessarily detrimental to operation and in fact can be advantageous because it allows the inductors to share coil formers and/or cores, which saves space and generally reduces cost. It also causes changes in the exact circuit element values required, which means, in certain embodiments, equation (2) is less precisely applicable (notwithstanding that the equation does not include loss terms for simplicity).

FIG. 7 is a block diagram of an instrument 44 using a multi-frequency RF power source 46, such as power source 20 or 32 above, in accordance with certain embodiments. In certain embodiments, the instrument may refer to a mass spectrometer. The multi-frequency RF power source 46 is used to drive an ion-manipulating structure 47 of the instrument. The ion-manipulating structure may be a rod assembly (such as a quadrupole, hexapole, or octupole), stack of ring electrodes, and so on. More generally, any structure that can benefit from a multi-frequency RF power source, for example to influence passing ions, can use power source 46. An ion source 50 delivers ions to the ion-manipulating structure directly or indirectly, and a detector 52 detects ions directly or indirectly, from the ion-manipulating structure. In certain embodiments, a mass analyzer, such as a quadrupole or a time or flight mass analyzer, is disposed between the ion-manipulating structure and the detector 52. In certain embodiments, the ion-manipulating structure is part of a mass analyzer. As explained above, multi-frequency RF power source 46 may be used to provide RF power at two or more frequencies simultaneously or in sequence.

Ion source 50 may be an electron impact (EI) source, an electrospray ionization (ESI) source, a chemical ionization (CI) source, a photoionization (PI) source, a matrix assisted laser desorption/ionization (MALDI) source, an inductively coupled plasma (ICP) source, a multi-mode source (such as a combination of ESI and CI), or any other ion source for mass spectrometers.

EXEMPLARY EMBODIMENTS

In addition to the embodiments described elsewhere in this disclosure, exemplary embodiments of the present invention include, without being limited to, the following:

1. A power source for providing high-voltage radio-frequency (RF) energy to an ion-manipulating structure of an instrument, the power source comprising:
   an oscillating RF signal generator configured to generate first and second RF signals respectively oscillating at first and second frequencies; and
   a voltage step-up circuit for magnifying the first and second RF signals, the step-up circuit including:
      an LC resonator network tuned to the first and second frequencies, and
      an output for providing the magnified power to the ion-manipulating structure.

2. The power source of embodiment 1, wherein the instrument is a mass spectrometer.

3. The power source of Embodiment 1 or 2, wherein the ion-manipulating structure comprises a multi-rod assembly.

4. The power source of Embodiment 1 or 2, wherein the ion-manipulating structure comprises a quadrupole.

5. The power source of Embodiment 1 or 2, wherein the ion-manipulating structure comprises a hexapole.

6. The power source of Embodiment 1 or 2, wherein the ion-manipulating structure comprises an octupole.

7. The power source of Embodiment 1 or 2, wherein the ion-manipulating structure comprises a stack of ring electrodes.

8. The power source of any of the preceding Embodiments, further comprising an RF power amplifier coupled between the RF signal generator and the voltage step-up circuit.

9. The power source of any of the preceding Embodiments, wherein the LC resonator network includes first and second branches, each branch having first and second inductors in series and having a capacitor connected across the first inductor.

10. The power source of Embodiment 9, further comprising a primary inductor winding through which the output of the RF power amplifier is coupled to the first and second branches of the LC resonator network in a parallel-series drive configuration.

11. The power source of Embodiment 9, wherein the output of the RF power amplifier is a differential output that is coupled to the first and second branches of the LC resonator network in a series drive configuration.

12. The power source of Embodiment 11, further comprising a transformer through which the differential output is coupled to the first and second branches of the LC resonator network.

13. The power source of Embodiment 12, wherein the transformer is configured to provide an impedance transformation between the RF power amplifier and the LC resonator network.

14. The power source of Embodiment 12, wherein the instrument includes a rod assembly driven by a DC voltage injected via taps on the transformer.

15. The power source of any of Embodiments 1-14, wherein the ion-manipulating structure comprises two rod sets configured to be driven by a single DC voltage.

16. The power source of any of Embodiments 1-14, wherein the ion-manipulating structure comprise two rod sets configured to be driven by a bipolar DC voltage supply that is split between the two rod sets.

17. The power source of any one of the preceding embodiments, wherein the oscillating RF signal generator includes:
   first and second RF signal sources for generating the first and second signals, respectively, and
   a summer for combining the first and second signals.

18. The power source of any of any one of the preceding embodiments, wherein the oscillating RF signal generator is configured to provide a third RF signal oscillating at a third frequency, and the LC resonator network is tuned to the first, second and third frequencies.

19. The power source of any of any one of the preceding embodiments, wherein the LC resonant network is series-driven and includes first and second inductors connected in series, the second inductor being coupled between two grounded capacitances.

20. The power source of any of any one of the preceding embodiments, wherein the LC resonant network is series-parallel driven and is coupled to the RF power amplifier via a primary inductor winding, the LC resonant network including first and second inductors connected in series, the second inductor being coupled between two grounded capacitances.

21. The power source of any of any one of the preceding embodiments, wherein a series-parallel LC topology is employed.

22. The power source of any one of the preceding embodiments, wherein the instrument comprises a time-of-flight analyzer.

23. The power source of any one of the preceding embodiments, wherein the instrument comprises a mass analyzer.

24. An instrument comprising:
   an ion-manipulating structure;
   an ion source for providing ions to the ion-manipulating structure;
   a detector coupled to the ion-manipulating structure for detecting ions; and
   a power source for providing high-voltage radio-frequency (RF) energy in accordance with any one of the preceding embodiments.

25. The instrument of embodiment 24, wherein the instrument is a mass spectrometer.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted based on the foregoing description.

The invention claimed is:

1. An instrument comprising:
   an ion-manipulating structure;
   an ion source to provide ions to the ion-manipulating structure;
   a detector coupled to the ion-manipulating structure to detect ions; and
   a power source to provide high-voltage radio-frequency (RF) energy, the power source comprising:
      an oscillating RF signal generator to selectively generate, concurrently or sequentially, first and second RF signals respectively oscillating at first and second frequencies, and a voltage step-up circuit to generate, for the first and second RF signals, magnified first and second RF signals, the voltage step-up circuit including:
an LC resonator network tuned to the first and second frequencies, and
an output to provide the magnified first and second RF signals to the ion-manipulating structure.

2. The instrument of claim 1, said instrument comprising a mass spectrometer.

3. The instrument of claim 1, said instrument comprising a time-of-flight analyzer.

4. The instrument of claim 1, said instrument comprising a mass analyzer.

5. The instrument of claim 1, wherein the ion-manipulating structure comprises a multi-rod assembly.

6. The instrument of claim 1, wherein the ion-manipulating structure comprises a quadrupole.

7. The instrument of claim 1, wherein the ion-manipulating structure comprises an octupole.

8. The instrument of claim 1, wherein the ion-manipulating structure comprises a stack of ring electrodes.

9. The instrument of claim 1, further comprising an RF power amplifier coupled between the oscillating RF signal generator and the voltage step-up circuit.

10. The instrument of claim 1, wherein the LC resonator network includes first and second branches, each branch having first and second inductors in series and having a capacitor connected across the first inductor.

11. The instrument of claim 10, further comprising a primary inductor winding through which an output of an RF power amplifier is coupled to the first and second branches of the LC resonator network in a parallel-series drive configuration.

12. The instrument of claim 11, wherein the output of the RF power amplifier is a differential output that is coupled to the first and second branches of the LC resonator network in a series drive configuration.

13. The instrument of claim 12, further comprising a transformer through which the differential output is coupled to the first and second branches of the LC resonator network.

14. The instrument of claim 13, wherein the transformer is to provide an impedance transformation between the RF power amplifier and the LC resonator network.

15. The instrument of claim 13, wherein the instrument includes a rod assembly driven by a DC voltage injected via taps on the transformer.

16. The instrument of claim 1, wherein the ion-manipulating structure comprises two rod sets that are driven by a single DC voltage.

17. The instrument of claim 1, wherein the ion-manipulating structure comprises two rod sets that are driven by a bipolar DC voltage supply that is split between the two rod sets.

18. The instrument of claim 1, wherein the oscillating RF signal generator includes:
first and second RF signal sources to generate the first and second RF signals, respectively, and
a summer to combine the first and second RF signals.

19. The instrument of claim 1, wherein the oscillating RF signal generator is to selectively generate, concurrently or sequentially, a third RF signal oscillating at a third frequency, and the LC resonator network is tuned to the first, second and third frequencies.

20. A power source to provide high-voltage radio-frequency (RF) energy to an ion-manipulating structure of an instrument, the power source comprising:
an oscillating RF signal generator to generate first and second RF signals respectively oscillating at first and second frequencies;
a summer to combine the first and second RF signals; and
a voltage step-up circuit to generate, for the first and second RF signals, magnified first and second RF signals, the voltage step-up circuit including:
an LC resonator network tuned to the first and second frequencies, and
an output to provide the magnified first and second RF signals to the ion-manipulating structure.

21. A power source to provide high-voltage radio-frequency (RF) energy to an ion-manipulating structure of an instrument, the power source comprising:
an oscillating RF signal generator to selectively generate, concurrently or sequentially, a plurality of RF signals, wherein each RF signal of the plurality of RF signals respectively oscillates at a specified frequency of a plurality of frequencies; and
a voltage step-up circuit to generate, for the plurality of RF signals, magnified plurality of RF signals that are provided to the ion-manipulating structure.

* * * * *